US011224135B2

(12) United States Patent
Song et al.

(10) Patent No.: US 11,224,135 B2
(45) Date of Patent: Jan. 11, 2022

(54) PCB ASSEMBLY STRUCTURE FOR ELECTRONIC APPLIANCE

(71) Applicant: SAMSUNG ELECTRONICS CO., LTD., Suwon-si (KR)

(72) Inventors: Ho-Kweon Song, Suwon-si (KR); Hyunkyu Park, Suwon-si (KR); Eunbi Kang, Suwon-si (KR); Minsik Kim, Suwon-si (KR); Taeyoun Yoon, Suwon-si (KR); Dongjin Lee, Suwon-si (KR); Junsu Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/941,008

(22) Filed: Jul. 28, 2020

(65) Prior Publication Data
US 2021/0204425 A1    Jul. 1, 2021

(30) Foreign Application Priority Data

Dec. 30, 2019    (KR) .................. 10-2019-0178365

(51) Int. Cl.
*H05K 5/00* (2006.01)
*H05K 5/02* (2006.01)
*H05K 1/02* (2006.01)

(52) U.S. Cl.
CPC ......... *H05K 5/0217* (2013.01); *H05K 1/0215* (2013.01); *H05K 5/0017* (2013.01);
(Continued)

(58) Field of Classification Search
USPC ....................................................... 361/753
See application file for complete search history.

(56) References Cited

U.S. PATENT DOCUMENTS

| 7,385,830 B2 * | 6/2008 | Liu ...................... H05K 7/142 |
| | | 174/138 R |
| 2005/0068261 A1 | 3/2005 | Oh |
| | (Continued) | |

FOREIGN PATENT DOCUMENTS

JP      2007-116556 A     5/2007
KR   10-2011-0026902 A     3/2011

OTHER PUBLICATIONS

International Search Report dated Nov. 13, 2020, in corresponding International Patent Application No. PCT/KR2020/008918.

*Primary Examiner* — Hung S. Bui
(74) *Attorney, Agent, or Firm* — Staas & Halsey, LLP

(57) ABSTRACT

A PCB assembly includes a panel including at least one guide protrusion, at least one mounting portion, and at least one dislocation prevention protrusion, and a PCB including at least one guide hole formed to correspond to the at least one guide protrusion, at least one grounding portion formed to correspond to the at least one mounting portion, and at least one dislocation prevention hole formed to correspond to the at least one dislocation prevention protrusion, wherein the PCB is guided to slide by the at least one guide protrusion and the at least one guide hole, is brought into close contact with the panel by the at least one mounting portion and the at least one grounding portion, and fixed to the panel as the at least one dislocation prevention hole is supported by the at least one dislocation prevention protrusion.

19 Claims, 13 Drawing Sheets

(52) U.S. Cl.
CPC ............... *H05K 5/0247* (2013.01); *H05K 2201/09063* (2013.01); *H05K 2201/2027* (2013.01)

(56) References Cited

U.S. PATENT DOCUMENTS

2005/0201070 A1    9/2005   Fan et al.
2017/0034941 A1*   2/2017   McCurley ............ H05K 7/1417
2018/0352665 A1    12/2018  Kim et al.

\* cited by examiner

PCB ASSEMBLY STRUCTURE FOR ELECTRONIC APPLIANCE

CROSS-REFERENCE TO RELATED APPLICATION(S)

This application claims the benefit of Korean Patent Application No. 10-2019-0178365, filed on Dec. 30, 2019 in the Korean Intellectual Property Office, the disclosure of which is incorporated herein by reference.

BACKGROUND

1. Field

Embodiments of the present disclosure relate to an electronic appliance, and more particularly, to an electronic appliance including a PCB assembly for realizing ultra-slim devices.

2. Description of the Related Art

In general, various electronic appliances such as electronic devices and communication devices include various parts and a printed circuit board (PCB) for electrically connecting the parts.

A PCB is fabricated by printing a circuit pattern on an electrically insulating board with a conductive material, as a flat board mounted with various types of electronic parts.

A PCB should be accurately seated on and fixed to a preset position of a case. To this end, the PCB and the case are generally assembled by using parts such as fastening screws through holes formed in both the PCB and the case or by using metal clips in a sliding method.

However, according to the methods using the fastening members such screws or clips, a height of the assembly needs to be corrected in accordance with heights of the screws or clips and manufacturing costs and manufacturing time are increased because parts are additionally used.

SUMMARY

Therefore, it is an aspect of the present disclosure to provide an electronic appliance including a PCB assembly for realizing ultra-slim devices.

It is another aspect of the present disclosure to provide an electronic appliance including a PCB assembly having an improved structure allowing a PCB to be directly mounted on a chassis.

It is another aspect of the present disclosure to provide an electronic appliance including a PCB assembly having a structure allowing assembling and disassembling of the PCB to be repeated.

Additional aspects of the disclosure will be set forth in part in the description which follows and, in part, will be obvious from the description, or may be learned by practice of the disclosure.

According to an aspect of an embodiment, a printed circuit board (PCB) assembly includes a panel including at least one guide protrusion, at least one mounting portion, and at least one dislocation prevention protrusion, and a PCB including at least one guide hole formed to correspond to the at least one guide protrusion, at least one grounding portion formed to correspond to the at least one mounting portion, and at least one dislocation prevention hole formed to correspond to the at least one dislocation prevention protrusion, wherein the PCB is guided to slide by the at least one guide protrusion and the at least one guide hole, brought into close contact with the panel by the at least one mounting portion and the at least one grounding portion, and fixed to the panel as the at least one dislocation prevention hole is supported by the at least one dislocation prevention protrusion.

The PCB may be directly fixed to the panel by the at least one guide protrusion and the at least one guide hole and by the at least one mounting portion and the at least one grounding portion.

The at least one guide hole may be formed in a horizontal direction for sliding movement with respect to the at least one guide protrusion.

The PCB may have a first region on which an electronic component is mounted, and a second region other than the first region.

The at least one guide hole may be formed at an upper portion or a lower portion of the second region, and the at least one guide protrusion is formed in the panel on a position corresponding to the at least one guide hole.

The at least one guide hole may be located at an upper portion or a lower portion of the second region in a diagonal direction to prevent rotational movement of the PCB.

The at least one grounding portion may be formed at one or more portions of the second region, and the at least one mounting portion is formed in the panel at a position corresponding to the at least one grounding portion.

The at least one mounting portion may include an open surface formed to be open allowing the PCB to be inserted thereinto, a fixing surface provided to hold the PCB, and two support surfaces extending from the fixing surface to be perpendicular to the fixing surface and provided to support the PCB.

The at least one mounting portion may include a guide extending from the fixing surface and guiding insertion of the PCB.

The guide may be formed to be inclined downward in a sliding direction of the PCB for coupling.

The dislocation prevention protrusion may include a stopper formed of at least one portion of the panel protruding upward, wherein the stopper is accommodated in the dislocation prevention hole to prevent the PCB from moving.

The dislocation prevention protrusion may further include an inclined plane for connection with the panel.

The inclined plane may be formed to be inclined upward in a sliding direction of the PCB for coupling.

According to another aspect of an embodiment, an electronic appliance includes a panel, and a printed circuit board (PCB) mounted on the panel, wherein the panel includes at least one guide protrusion, at least one mounting portion, and at least one dislocation prevention protrusion, the PCB includes at least one guide hole formed to correspond to the at least one guide protrusion, at least one grounding portion formed to correspond to the at least one mounting portion, and at least one dislocation prevention hole formed to correspond to the at least one dislocation prevention protrusion, and the PCB is guided to slide by the at least one guide protrusion and the at least one guide hole, brought into close contact with the panel by the at least one mounting portion and the at least one grounding portion, and fixed to the panel as the at least one dislocation prevention hole is supported by the at least one dislocation prevention protrusion.

The at least one guide hole may be formed in a horizontal direction for sliding movement with respect to the at least one guide protrusion.

The at least one guide hole may be located at an upper portion or a lower portion of the PCB in a diagonal direction to prevent rotational movement of the PCB.

The at least one grounding portion may be formed at one or more portions of the PCB, and the at least one mounting portion is formed in the panel at a position corresponding to the at least one grounding portion.

The at least one mounting portion may include an open surface formed to be open allowing the PCB to be inserted thereinto, a fixing surface provided to hold the PCB, and two support surfaces extending from the fixing surface to be perpendicular to the fixing surface and provided to support the PCB.

The at least one mounting portion may include a guide extending from the fixing surface to be inclined downward in a sliding direction of the PCB for coupling and guiding insertion of the PCB.

The dislocation prevention protrusion may include a stopper formed of at least one portion of the panel protruding upward, wherein the stopper is accommodated in the dislocation prevention hole to prevent the PCB from moving.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
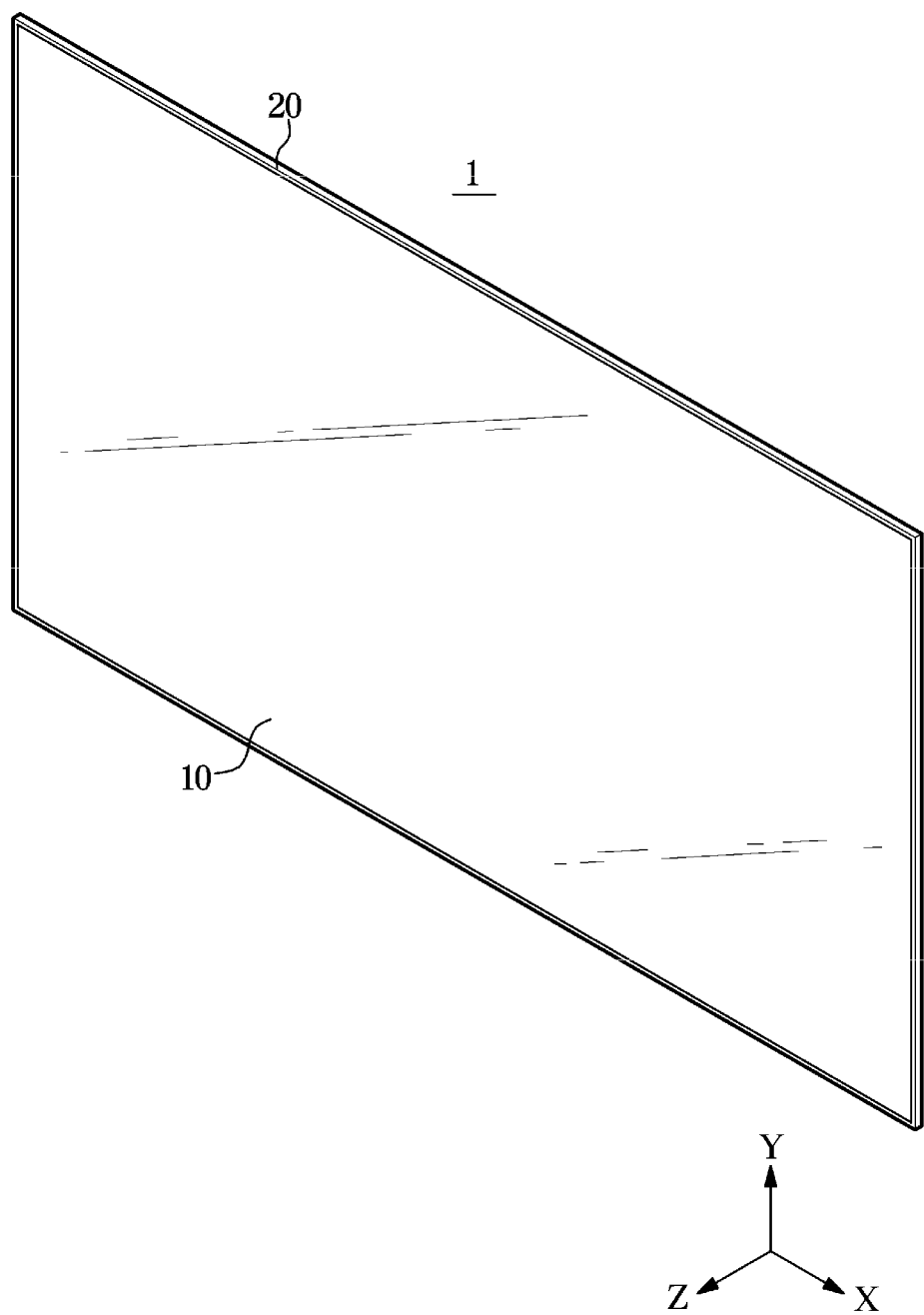
FIG. 1 is a perspective view illustrating a display apparatus according to an embodiment of the present disclosure.

Reference will now be made in detail to the embodiments of the present disclosure, examples of which are illustrated in the accompanying drawings, wherein like reference numerals refer to like elements throughout. The present disclosure may, however, be embodied in many different forms and should not be construed as being limited to the embodiments set forth herein; rather, these embodiments are provided so that this disclosure will be thorough and complete, and will fully convey the concept of the disclosure to those of ordinary skill in the art.

Also, the terms used in the present specification are merely used to describe particular embodiments, and are not intended to limit the present disclosure. An expression used in the singular encompasses the expression of the plural, unless it has a clearly different meaning in the context. In the present specification, it is to be understood that the terms such as "including" or "having," etc., are intended to indicate the existence of the features, numbers, operations, components, parts, or combinations thereof disclosed in the specification, and are not intended to preclude the possibility that one or more other features, numbers, operations, components, parts, or combinations thereof may exist or may be added.

It will be understood that, although the terms "first", "second", etc., may be used herein to describe various elements, these elements should not be limited by these terms. The above terms are used only to distinguish one component from another. For example, a first component discussed below could be termed a second component, and similarly, the second component may be termed the first component without departing from the teachings of this disclosure. As used herein, the term "and/or" includes any and all combinations of one or more of the associated listed items.

Hereinafter, embodiments of the present disclosure will be described with reference to the accompanying drawings. The present disclosure may be applied to any electronic appliance including a PCB assembly.

A printed circuit board (PCB) refers to a board on which an electronic circuit is formed and to which electronic parts such as an integrated circuit board, a resistor, and a condenser are fixed such that the electronic parts are connected with one another by wires. Hereinafter, a display apparatus mounted with a PCB will be described by way of example.

Figure 2:
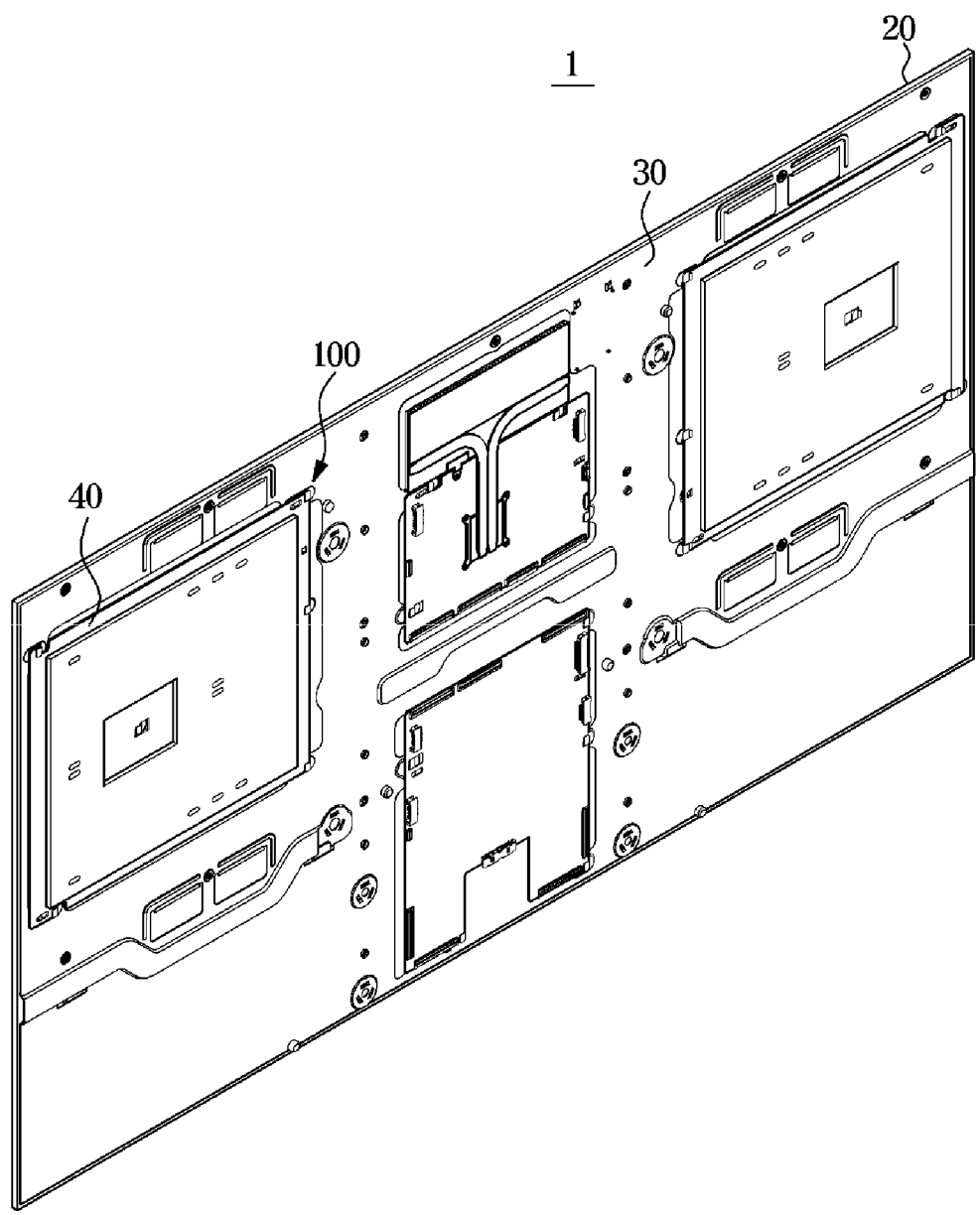
FIG. 2 is a view illustrating a display apparatus mounted with a PCB assembly according to an embodiment of the present disclosure.

FIG. 1 is a perspective view illustrating a display apparatus according to an embodiment of the present disclosure. FIG. 2 is a view illustrating a display apparatus mounted with a PCB assembly according to an embodiment of the present disclosure.

As shown in FIGS. 1 and 2, a display apparatus (electronic appliance) 1 is an apparatus that displays information, materials, data, and the like as text, figures, graphs, images, or the like and includes TVs, PCs, mobile devices, and digital signages. The display apparatus 1 may be installed on the ground using a stand (not shown) or mounted on a wall.

The display apparatus 1 may include a display module 10 having a flat panel shape and a cover 20 constituting front edges and side appearances of the display apparatus 1.

The display apparatus 1 may include a chassis (hereinafter, referred to as panel) 30 that supports the display module 10. The panel 30 may be interposed between the display module 10 and the cover 20.

The display module 10 may include a display panel on which an image is displayed and a backlight unit (not shown). The backlight unit may include a light source and an optical member such as a light guide plate. The display module 10 may include the light source disposed behind the display panel and the light guide plate provided to guide light emitted from the light source toward the display panel.

The light guide plate converts light emitted from the light source into light in a form emitted from a surface light source and guides the converted light toward the display panel.

The panel 30 may be located to support the display module 10. The cover 20 may be located behind the panel 30.

The display apparatus 1 may include at least one printed circuit board (PCB) assembly 100 electrically connected to the display module 10. At least one PCB 40 may be mounted on the panel 30. In an embodiment of the present disclosure, the PCB 40 mounted on the panel 30 is exemplarily illustrated, but the panel 30 may further include any other element such as a case, a bracket, or the like in addition to the panel mounted with the PCB 40.

The at least one PCB 40 may include a power supply board, a signal processing board, a driving circuit board, and the like. Specifically, a circuit device configured to supply power to the display module 10 may be disposed on the power supply board. A circuit device configured to receive and process external signals may be disposed on the signal processing board. The driving circuit board may be provided to drive the display module 10. The power supply board, the signal processing board, and the driving circuit board may be independently arranged or incorporated.

Figure 3:
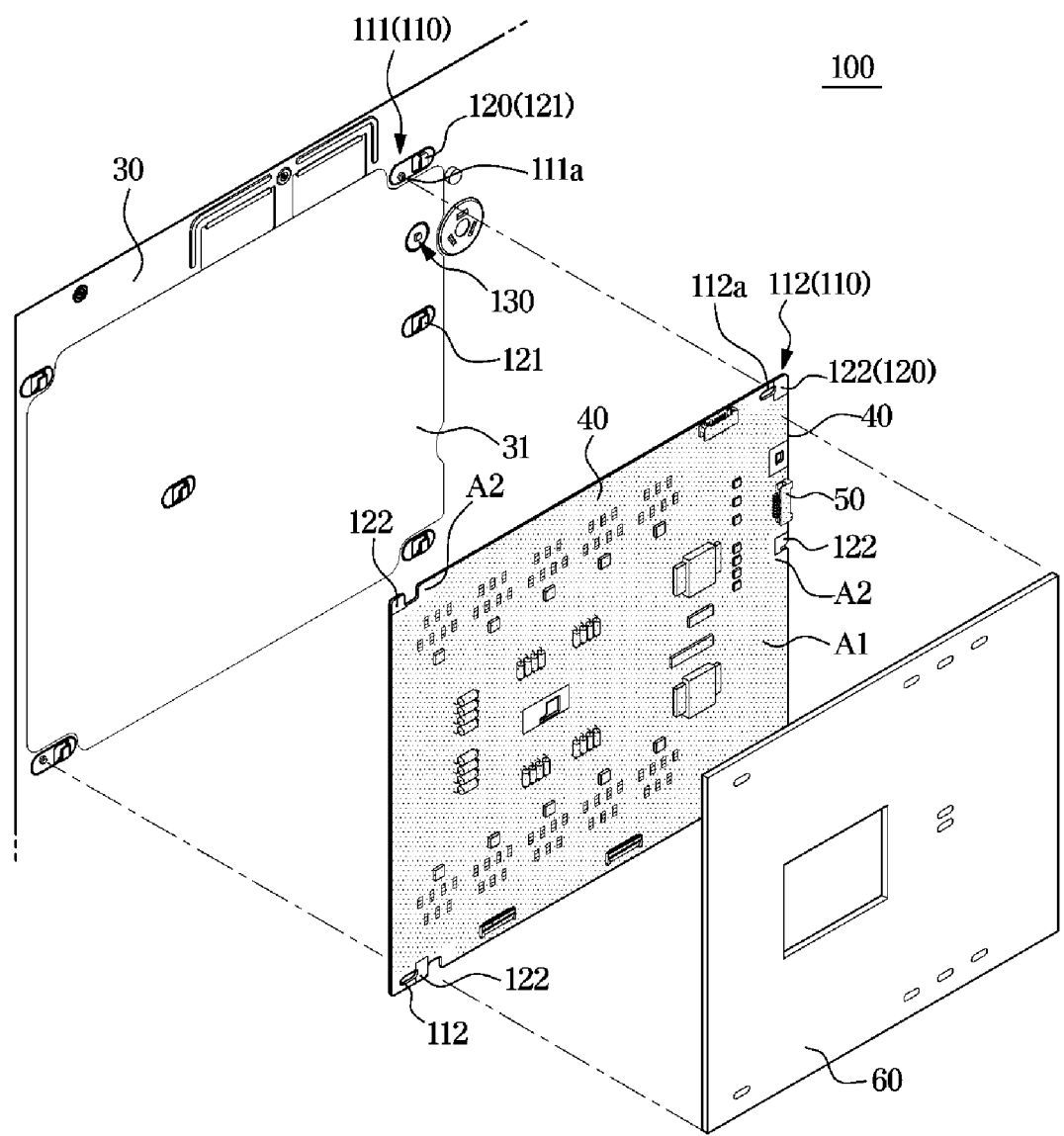
FIG. 3 is a view illustrating a PCB mounted on a panel in a PCB assembly according to an embodiment of the present disclosure.
Figure 4:
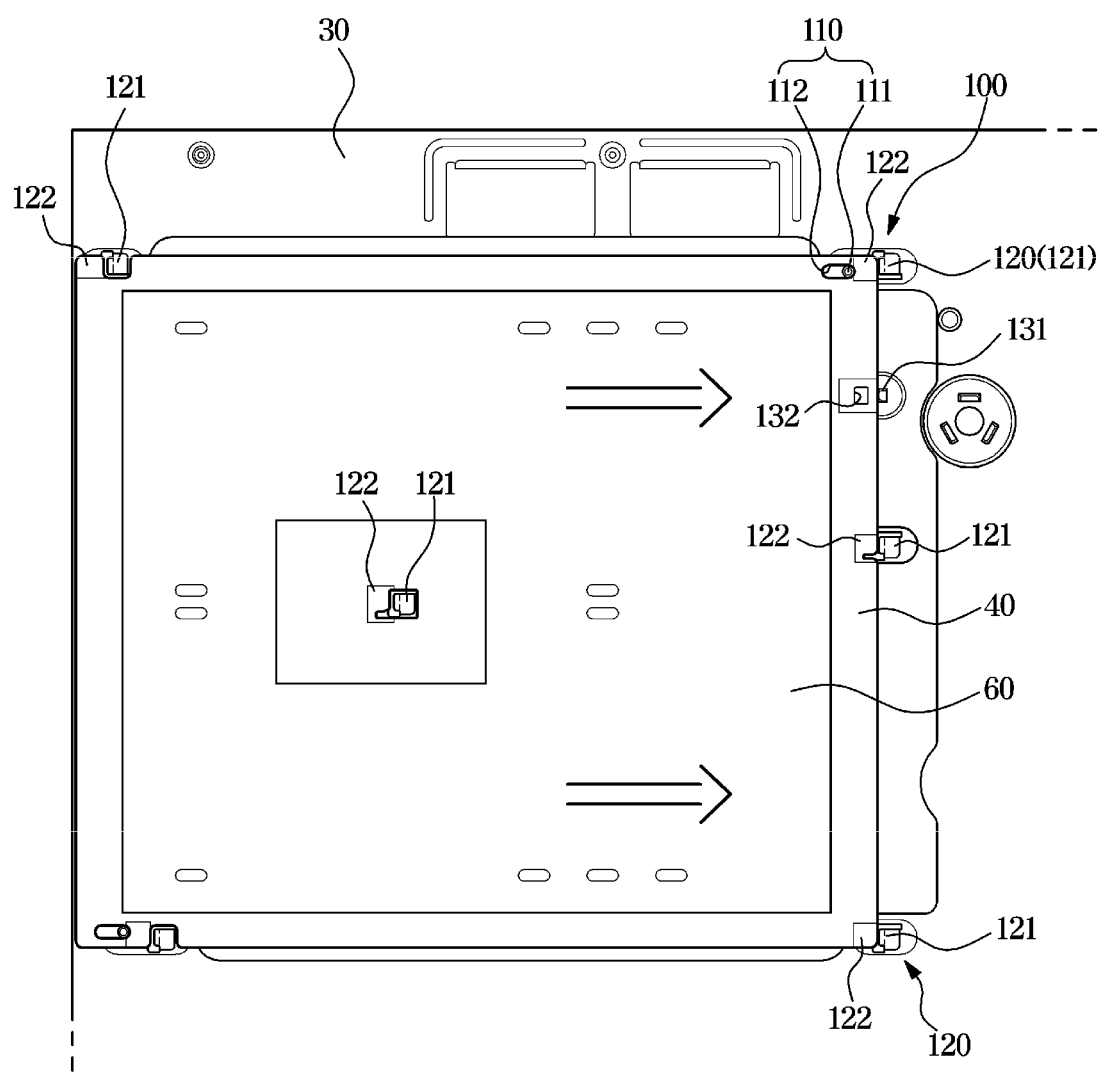
FIG. 4 is a view illustrating a state before a PCB is mounted on a panel according to an embodiment of the present disclosure.
Figure 5:
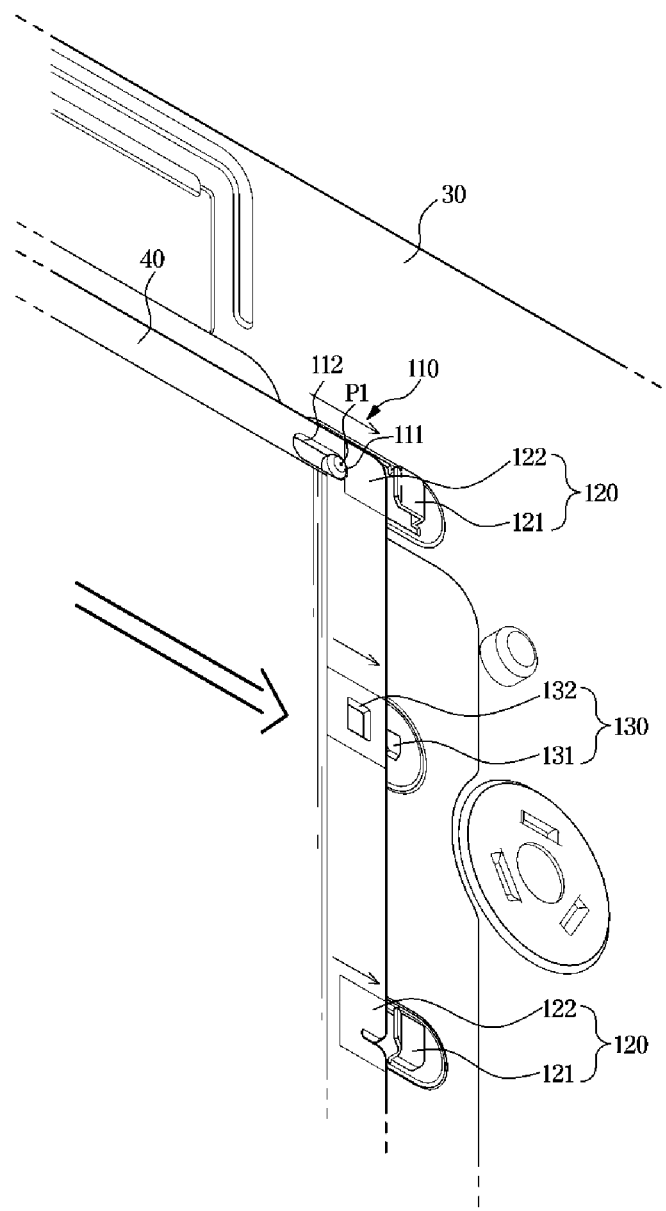
FIG. 5 is a perspective view illustrating an operation of mounting a PCB on a panel according to an embodiment of the present disclosure.
Figure 6:
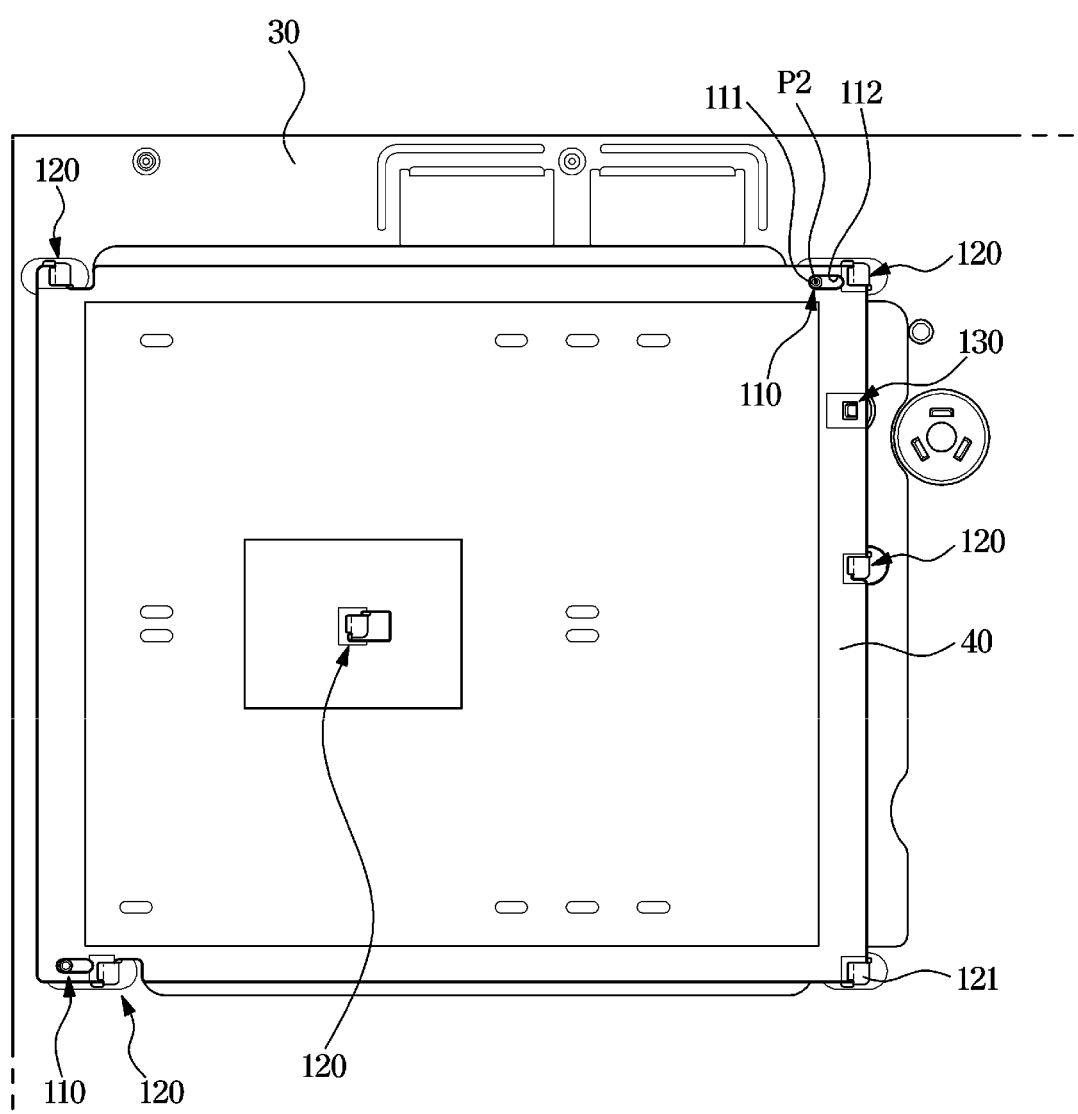
FIG. 6 is a view illustrating a PCB mounted on a panel according to an embodiment of the present disclosure.

FIG. 3 is a view illustrating a PCB mounted on a panel in a PCB assembly according to an embodiment of the present disclosure. FIG. 4 is a view illustrating a state before a PCB disclosure is mounted on a panel according to an embodiment of the present. FIG. 5 is a perspective view illustrating an operation of mounting a PCB on a panel according to an embodiment of the present disclosure. FIG. 6 is a view illustrating a PCB mounted on a panel according to an embodiment of the present disclosure.

As shown in FIGS. 3 to 6, the PCB assembly 100 includes the panel 30 and the PCB 40 mounted on the panel 30.

The panel 30 may have a PCB seating portion 31 on which the PCB 40 is mounted. The PCB seating portion 31 may be formed of a conductive material such that the PCB 40 is grounded on the panel 30. The PCB seating portion 31 may be integrally formed with the panel 30 or may be separately formed and coupled to the panel 30 to be in electrical communication with the panel 30. Various methods such as welding or adhering using a conductive adhesive may be used to couple the PCB seating portion 31 to the panel 30 to be in electrical communication with each other.

The PCB seating portion 31 may be formed in a shape corresponding to the panel 30 such that both are in complete contact with each other. Although a flat PCB seating portion is exemplarily illustrated such that the PCB 40 is seated thereon, the present disclosure is not limited thereto. For example, when a curved PCB is mounted on a curved display apparatus, the PCB seating portion may be formed in a curved shape.

Although not shown in the drawings, the PCB 40 may be formed by bonding an upper layer, in which a copper thin-film for forming a circuit pattern is thermally compressed on an insulating film, to a lower layer, in which a copper thin-film for forming a circuit pattern is thermally compressed on an insulating film, via a bonding sheet. Dry films for forming the circuit patterns are laminated respectively on the copper thin-films of the upper layer and the lower layer, and the circuit patterns are completely formed by a light exposure process and an etching process, and mounting portions for mounting electronic components are provided. The mounting portion is exposed upwards, and a protective film may be attached to the upper surface thereof except for the mounting portion.

The mounting portions may also be mounted on both surfaces of the PCB 40 such that the electronic components 50 may be mounted on the surfaces of the PCB 40. That is, the PCB 40 may be electrically connected to the electronic components 50 mounted on the upper surface of the PCB 40 by wire bonding or a bumping process.

The PCB 40 may include a cover 60 that covers an external surface thereof. The cover 60 may be provided to protect the electronic components 50 mounted on the PCB 40.

The PCB 40 may have a first region A1 on which the electronic components 50 are mounted and a second region A2, other than the first region A1, on which electronic components 50 are not mounted. Although the PCB 40 mounted with the electronic components 50 on the upper surface thereof is exemplarily illustrated in an embodiment of the present disclosure, the present disclosure is not limited thereto. For example, electronic components may be mounted on the upper surface and the lower surface of the PCB 40, respectively.

The first region A1 may include one region of the upper surface or the lower surface of the PCB 40 on which the electronic components 50 are able to be mounted. The second region A2 may include the other region of the upper surface or the lower surface of the PCB 40 on which the electronic components 50 are not mounted.

The PCB 40 may be mounted directly on the panel 30 by sliding in a horizontal direction. After the PCB 40 is seated on the PCB seating portion 31, the PCB 40 may slide in the horizontal direction to be mounted directly on the panel.

The PCB assembly 100 may include a guide portion 110 provided to guide the PCB 40 on the panel 30, a fixing portion 120 to fix the PCB 40 guided by the guide portion 110 to the panel 30, and a dislocation prevention portion 130 provided to prevent dislocation or separation of the PCB 40 fixed to the panel 30 by the fixing portion 120.

The guide portion 110 provided to guide movement of the PCB 40 may include a first guide portion 110 formed at the panel 30 and a second guide portion 110 formed at the PCB 40 to correspond to the first guide portion 110. The second guide portion 110 may be disposed in the second region A2 of the PCB 40.

At least one guide portion 110 may be formed. The guide portion 110 may be provided in plural. The guide portions 110 may be located in a diagonal direction of the PCB 40 and the panel 30. The guide portions 110 may be located at upper and lower portions of the panel 30 and the second region A2 of the PCB 40, respectively. The guide portions 110 may be located at a right upper portion and a left lower portion of the panel 30 and the PCB 40, respectively. The guide portions 110 be located in a diagonal direction at the panel 30 and the PCB 40.

The first guide portion 110 may include a guide protrusion 111. The guide protrusion 111 may be formed at the panel 30. The guide protrusions 111 may be formed at upper and lower portions of the PCB seating portion 31 of the panel 30, respectively. The guide protrusions 111 may be formed at a right upper portion and a left lower portion of the PCB seating portion 31 of the panel 30, respectively. The guide protrusion 111 may protrude from the panel 30.

The second guide portion 110 may have a guide hole 112 formed in the PCB 40. The guide hole 112 may be formed to correspond to the guide protrusion 111. The guide hole 112 may be formed in the second region A2 of the PCB 40.

The guide hole 112 may be formed in a right upper portion and a left lower portion of the PCB 40, respectively. The guide hole 112 may be formed in a horizontal direction to have a predetermined length such that the guide protrusion 111 slides therein. The guide protrusion 111 may be inserted into the guide hole 112 of the PCB 40 such that the PCB 40 slides therein in a transversal direction.

The guide portions 110 may be arranged at the right upper portion and the left lower portion in a diagonal direction of the panel 30 and the PCB 40 to prevent rotating movement of the PCB 40. The guide holes 112 of the guide portions 110 are arranged at a right upper portion and a left lower portion of the PCB 40 in a diagonal direction, and the guide protrusions 111 are arranged at a right upper portion and a left lower portion of the panel 30 in a diagonal direction, thereby preventing rotational movement of the PCB 40 coupled to the guide protrusions 111 of the panel 30.

As shown in FIGS. 5 and 6, the PCB 40 may be coupled to the panel 30 by sliding in a horizontal direction. The PCB 40 may be coupled to the panel 30 by sliding in the horizontal direction from left to right.

The guide protrusion 111 may protrude in a cylindrical shape protruding from the panel 30. The guide protrusion 111 of the panel 30 may be inserted into the guide hole 112 of the PCB 40. The guide protrusion 111 of the panel 30 may be located at a first position P1 of the guide hole 112 of the PCB 40. In this case, the PCB 40 is provided in a state not coupled to the panel 30.

By sliding the PCB 40 in the horizontal direction to mount the PCB 40 on the panel 30 in a state where the guide protrusion 111 is located at the first position P1 of the guide hole 112, the guide hole 112 is guided by the guide protrusion 111 so as to move the PCB 40. The guide protrusion 111 of the panel 30 is located at a second position P2 of the guide hole 112. In this case, the PCB 40 is provided in a state coupled to the panel 30.

The PCB 40 may be fixed to the panel 30 by at least one fixing portion 120. The PCB 40 mounted on the panel 30 by the fixing portion 120 may not be dislocated or separated from the panel 30 by the dislocation prevention portion 130.

Figure 7:
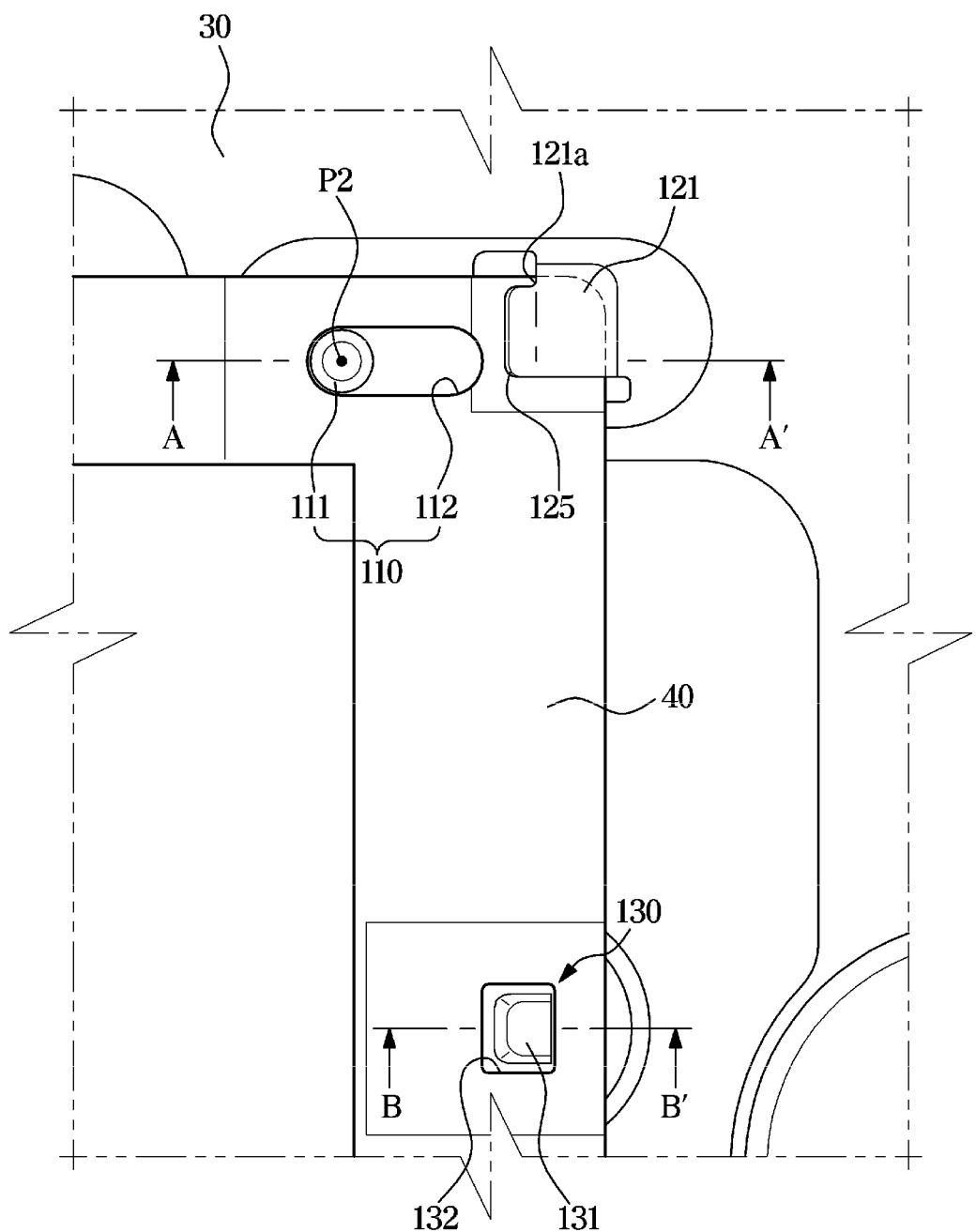
FIG. 7 is an enlarged partial view of a PCB mounted on a panel according to an embodiment of the present disclosure.
Figure 8:
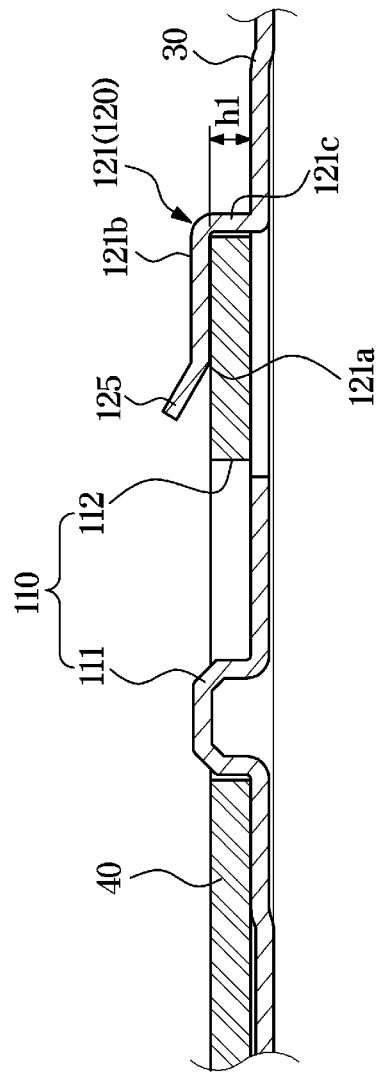
FIG. 8 is a cross-sectional view taken along line A-A' of FIG. 7 illustrating a fixing portion of the panel and the PCB.
Figure 9:
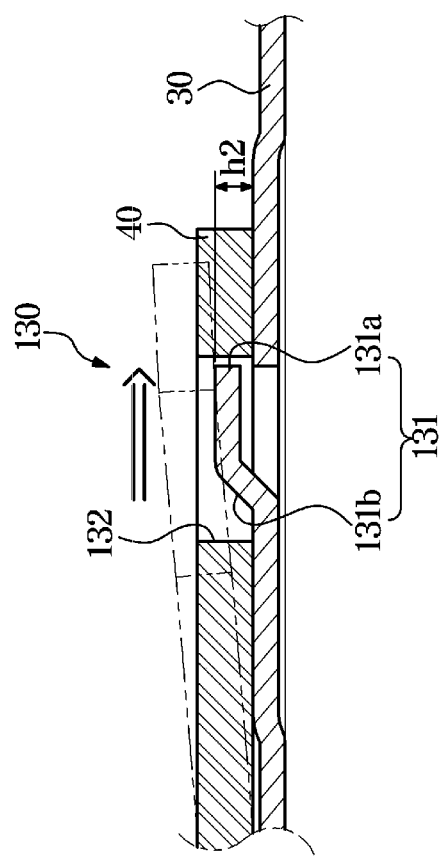
FIG. 9 is a cross-sectional view taken along line B-B' of FIG. 7 illustrating coupling of a dislocation prevention portion of the panel and a dislocation prevention hole of the PCB according to an embodiment of the present disclosure.

FIG. 7 is an enlarged partial view of a PCB mounted on a panel according to an embodiment of the present disclosure. FIG. 8 is a cross-sectional view taken along line A-A' of FIG. 7 illustrating a fixing portion of the panel and the PCB. FIG. 9 is a cross-sectional view taken along line B-B' of FIG. 7 illustrating coupling of a dislocation prevention portion of the panel to a dislocation prevention hole of the PCB according to an embodiment of the present disclosure.

As illustrated in FIGS. 7 to 9, when the PCB 40 slides by the guide portion 110, the PCB 40 may be fixed to the panel 30 by the fixing portion 120.

At least one fixing portion 120 may be provided. The fixing portion 120 may be located at the second region A2 of the PCB 40.

The fixing portion 120 may include a mounting portion 121 formed at the panel 30 and a grounding portion 122 formed at the PCB 40 to correspond to the mounting portion 121. The mounting portion 121 and the grounding portion 122 may be provided in plural respectively and located at the panel 30 and the PCB 40 to correspond to each other.

The grounding portion 122 of the PCB 40 may be formed at the second region A2 and a plurality of the grounding portions 122 may be arranged at various positions in accordance with the size and shape of the PCB 40. The grounding portion 122 of the PCB 40 may be formed at a position corresponding to the mounting portion 121 formed at the panel 30.

A plurality of mounting portions 121 may be formed at the panel 30. The mounting portion 121 is provided such that the PCB 40 moved by sliding is seated and supported thereby.

The mounting portion 121 may be provided to accommodate the grounding portion 122 formed at one or more portions of the PCB 40. The grounding portion 122 of the PCB 40 may be formed by fixing a copper thin-film. The grounding portion 122 of the PCB 40 may be connected to the mounting portion 121 of the fixing portion 120 to be electrically grounded to the panel 30.

In an embodiment of the present disclosure, the grounding portions 122 of the PCB 40 formed at upper and lower edges of the right side, at upper and lower edges of the left side, and at the center of the PCB 40 are exemplarily illustrated, but the present disclosure is not limited thereto. For example, the number and the positions of the fixing portions may vary according to the size and the shape of the PCB 40.

The mounting portion 121 may be formed by cutting at least one portion of the panel 30. The mounting portion 121 may include an open surface 121a formed to be open allowing the PCB 40 to be inserted thereinto, a fixing surface 121b provided to press the PCB 40 inserted through the open surface 121a, and a support surface 121c provided to connect the fixing surface 121b with the panel 30.

The open surface 121a of the mounting portion 121 may be formed at a first height h1 from the upper surface of the panel 30. The first height h1 of the open surface 121a of the mounting portion 121 may be formed to correspond to a height of the PCB 40.

The mounting portion 121 may have at least two open surfaces 121a formed in a direction into which the PCB 40 is inserted by sliding. For example, the mounting portion 121 to which the grounding portion 122 of the right upper edge of the PCB 40 is coupled may have left and lower open surfaces 121a. The PCB 40 may be inserted into the mounting portion 121 and coupled thereto through the left and lower open surfaces 121a of the mounting portion 121.

The fixing surface 121b of the mounting portion 121 is provided to cover the upper surface of the PCB 40. The fixing surface 121b may extend from the panel 30 to be perpendicular thereto. The fixing surface 121b may be connected to the panel 30 via at least two support surfaces 121c. The support surfaces 121c may be provided to support the PCB 40. The fixing surface 121b is provided on the PCB 40 to press the PCB 40 coupled thereto such that the PCB 40 is stably coupled thereto. The at least two support surfaces 121c are connected to the panel 30 such that the PCB 40 is supported by the panel 30 with a strong fastening force.

The mounting portion 121 may further include a guide 125 to guide insertion of the PCB 40. The guide 125 may extend from the fixing surface 121b. The guide 125 is provided to allow the PCB 40 to be inserted into mounting portion 121. The guide 125 may be formed at one end of the fixing surface 121b. The guide 125 may be formed to be inclined downward in a direction where the PCB 40 is coupled thereto by sliding. The guide 125 may be provided to guide slide-assembling of the PCB 40.

The dislocation prevention portion 130 is provided to prevent the PCB 40 from being separated from the panel 30. The dislocation prevention portion 130 may include a dislocation prevention protrusion 131 formed at the panel 30 and a dislocation prevention hole 132 formed in the PCB 40.

The dislocation prevention protrusion 131 may be formed of at least one portion of the panel 30 protruding upward. The dislocation prevention protrusion 131 may be coupled to the dislocation prevention hole 132 to prevent the PCB 40 from being separated from the panel 30. The dislocation prevention protrusion 131 may include a stopper 131a vertically formed. The stopper 131a is formed at one end of the dislocation prevention protrusion 131 and inserted into the dislocation prevention hole 132 to prevent the PCB 40 from moving. After the PCB 40 is coupled to the fixing portion 120 of the panel 30, the dislocation prevention hole 132 may be caught by the stopper 131a of the panel 30 to prevent the PCB 40 from moving.

The dislocation prevention protrusion 131 may further have an inclined plane 131b for connection with the panel 30. The PCB 40 may slide from left to right along the inclined plane 131b of the panel 30. The PCB 40 may easily climb over the dislocation prevention protrusion 131 along the inclined plane 131b of the panel 30.

The dislocation prevention protrusion 131 may be formed at a second height h2. The second height h2 of the dislocation prevention protrusion 131 may be from the upper surface of the panel 30. The second height h2 of the dislocation prevention protrusion 131 may be less than the first height of the open surface 121a of the mounting portion 121.

Since the second height h2 of the dislocation prevention protrusion 131 is less than the first height h1 of the open surface 121a of the mounting portion 121, at least one portion of the PCB 40 is guided toward the bottom by the guide 125 of the fixing portion 120 and climbs over the inclined plane 131b of the dislocation prevention portion 130 while the PCB 40 slides from left to right, thereby forming a partially bent portion. However, the PCB 40 may be mounted on the panel 30 to be in close contact with the bottom by the fixing portion 120. By the PCB 40 mounted on the panel 30 to be in close contact therewith, coupling therebetween is improved and the grounding ability may be improved.

A mounting operation of the PCB 40 on the panel 30 according to an embodiment of the present disclosure will be described.

In a state before the PCB 40 is mounted on the panel 30, the guide hole 112 of the PCB 40 is seated on the guide protrusion 111 of the panel 30 and located at the first position P1.

In this case, the guide hole 112 and the guide protrusion 111 are located in the diagonal direction of the PCB 40 and the panel 30 to prevent the PCB 40 and the panel 30 from rotating.

When the PCB 40 slides to the right in the horizontal direction, the guide 125 of the fixing portion 120 presses the PCB 40 toward the bottom such that the PCB 40 is inserted into the open surface 121a and the mounting portion 121.

The PCB 40 climbs over the dislocation prevention protrusion 131 along the inclined plane 131b of the dislocation prevention portion 130 and is inserted into the dislocation prevention hole 132 to be assembled.

In a state where the PCB 40 is mounted on the panel 30, the guide hole 112 of the PCB 40 is seated on the guide protrusion 111 of the panel 30 and located at the second position P2.

When the sliding of the PCB 40 is completed, the dislocation prevention hole 132 of the PCB 40 is coupled to the dislocation prevention protrusion 131 of the panel 30. Specifically, the stopper 131a of the dislocation prevention protrusion 131 corresponding to the dislocation prevention hole 132 prevents the PCB 40 from moving in the opposite direction.

The grounding portion 122 of the PCB 40 is fixed to the mounting portion 121 and grounding and EMI performance may be obtained by the grounding portion 122 of the PCB 40.

Figure 10:
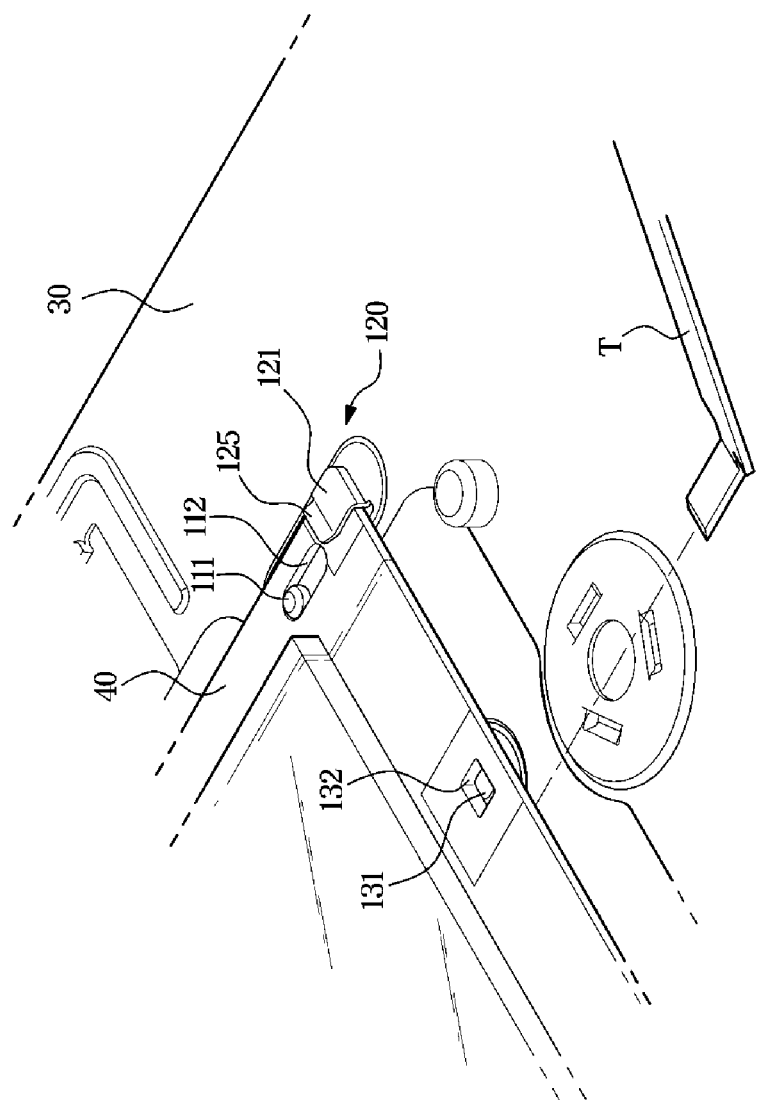
FIGS. 10 and 11 are views illustrating separation of a PCB from a panel according to an embodiment of the present disclosure.
Figure 11:
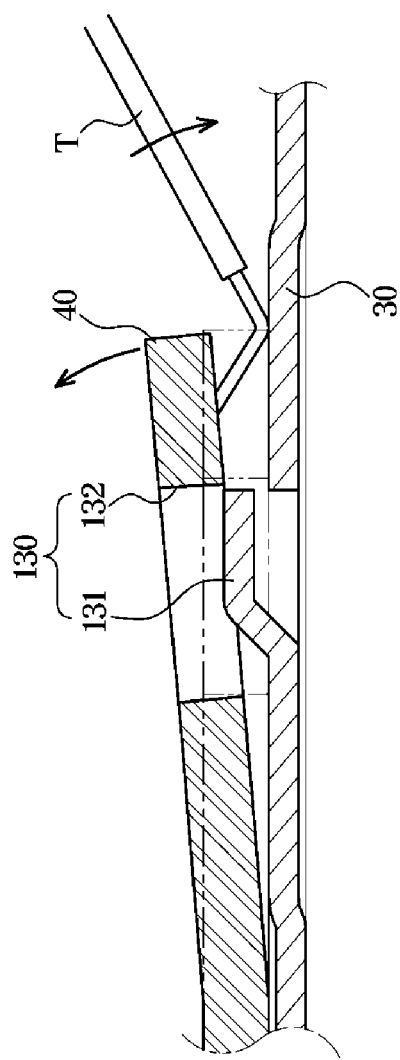

FIGS. 10 and 11 are views illustrating separation of a PCB from a panel according to an embodiment of the present disclosure.

As shown in FIGS. 10 and 11, the PCB 40 directly mounted on the panel 30 by the fixing portion 120 may be fixedly mounted thereon by the dislocation prevention portion 130.

In a state where the PCB 40 is coupled to the panel 30, the grounding portion 122 of the PCB 40 is inserted into the mounting portion 121.

The PCB 40 is disassembled from the panel 30 by raising the dislocation prevention hole 132 of the PCB 40 to be higher than the dislocation prevention protrusion 131 and the stopper 131a of the panel 30. The user raise the PCB 40 upward by applying an external force thereto using a separate tool T or a hand (not shown).

In this case, the user may raise an edge near the dislocation prevention portion 130 of the PCB 40 upward. Although the dislocation prevention portion 130 formed at the right edge of the PCB 40 is exemplarily illustrated, the present disclosure is not limited thereto. The dislocation prevention portion 130 may preferably be located near the guide portion 110 and the fixing portion 120 but may also be formed at a portion of the second region A2 of the PCB 40.

By raising the PCB 40 to be higher than the dislocation prevention protrusion 131 and the stopper 131a, and then sliding the PCB 40 in a reverse direction of assembling, the PCB 40 may move to an initial position.

By raising the PCB 40 to be higher than the dislocation prevention protrusion 131 and the stopper 131a, and then sliding the PCB 40 to the left, the guide protrusion 111 moves to the first position P1 of the guide hole 112.

According to the above-described sliding method, the PCB 40 may be easily assembled and disassembled, thereby simplifying a manufacturing process and increasing productivity obtained thereby.

Also, separate fixing parts are unnecessary, and thus costs for materials may be reduced.

Figure 12:
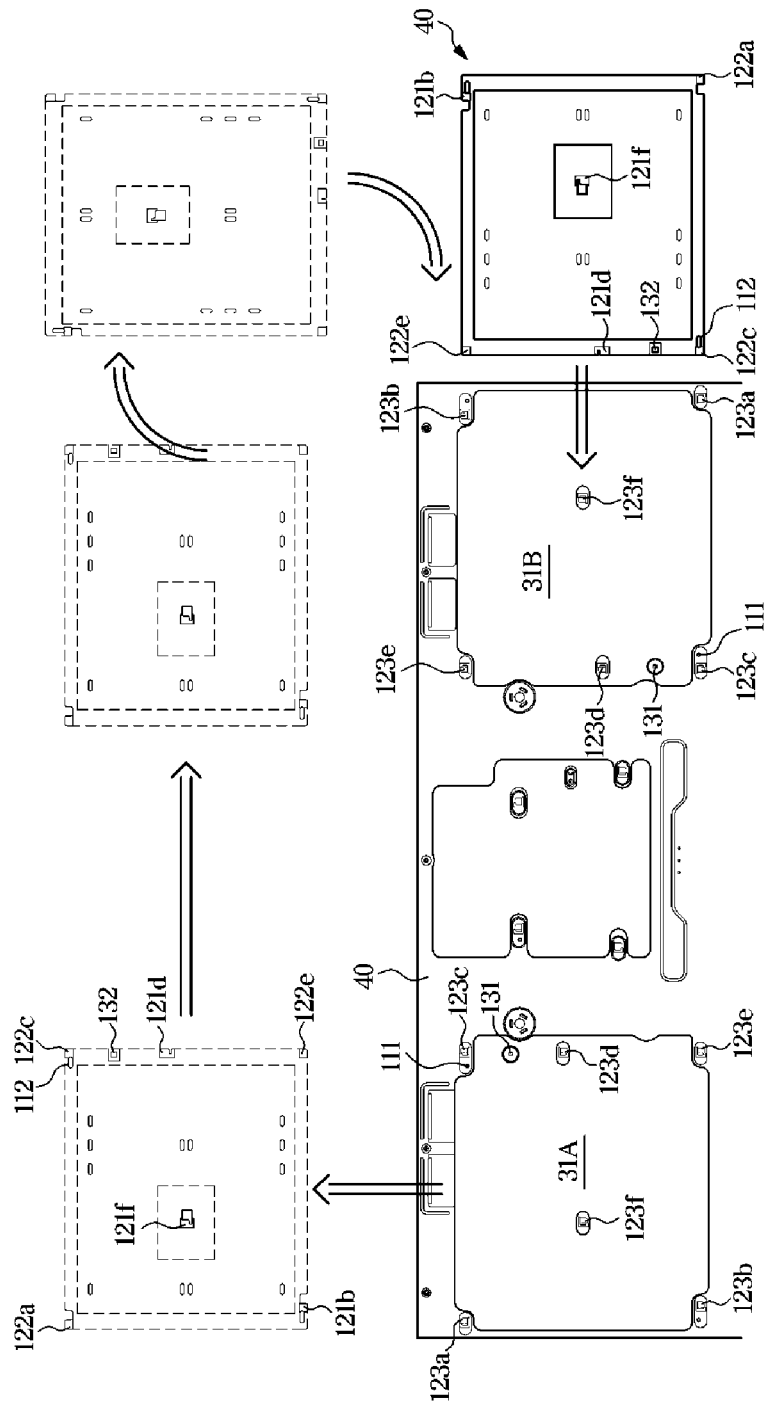
FIG. 12 is a view schematically illustrating a common-use state of a panel and a PCB according to an embodiment of the present disclosure.

FIG. 12 is a view schematically illustrating a common-use state of a panel and a PCB according to an embodiment of the present disclosure.

As shown in FIG. 12, the PCB 40 may be fixed to the panel 30 via the guide portion 110, the fixing portion 120, and the dislocation prevention portion 130.

In this regard, each of the guide portion 110, the fixing portion 120, and the dislocation prevention portion 130 for directly fixing the PCB 40 to the panel 30 may be located in the second region A2 of the PCB 40 and in a portion of the panel 30 corresponding to the second region A2, respectively.

For example, with respect to a first PCB seating portion 31A of the panel 30, the guide protrusions 111 are formed at the right upper edge and the left lower edge respectively, and the mounting portion 121 may include a first mounting portion 123a formed at the left upper edge of the first PCB seating portion 31A, a second mounting portion 123b formed at the left lower edge, a third mounting portion 123c formed at the right upper edge, a fourth mounting portion 123d formed at the right center, a fifth mounting portion 123e formed at the right lower edge, and a sixth mounting portion 123f formed at the center of the first PCB seating portion 31A.

In addition, the PCB 40 may include a first grounding portion 121*a* formed at the left upper edge, a second grounding portion 121*b* formed at the left lower edge, a grounding portion 121*c* formed at the right upper edge, a fourth grounding portion 121*d* formed at the right center, a fifth grounding portion 121*e* formed at the right lower edge, and a sixth grounding portion 121*f* formed at the center of the PCB 40 respectively corresponding to the mounting portion 121. The first to sixth grounding portions 121*a* to 121*f* may be formed at any positions in the second region A2 on which the electronic components 50 of the PCB 40 are not mounted.

Since the guide portion 110, the fixing portion 120, and the dislocation prevention portion 130 used to directly mounting the PCB 40 on the panel 30 may be formed at any portions of the second region A2 on which the electronic components 50 of the PCB 40 are not mounted, they may be applied to the PCB 40 and the panel 30 with any sizes and shapes.

For example, the PCB 40 may be mounted on a second PCB seating portion 31B symmetrically formed with the first PCB seating portion 31A by rotating the PCB 40 180 degrees.

In this case, a sliding direction of the PCB 40 may be a right-to-left direction. By commonly using the PCB 40 as described above, productivity may be improved.

Figure 13:
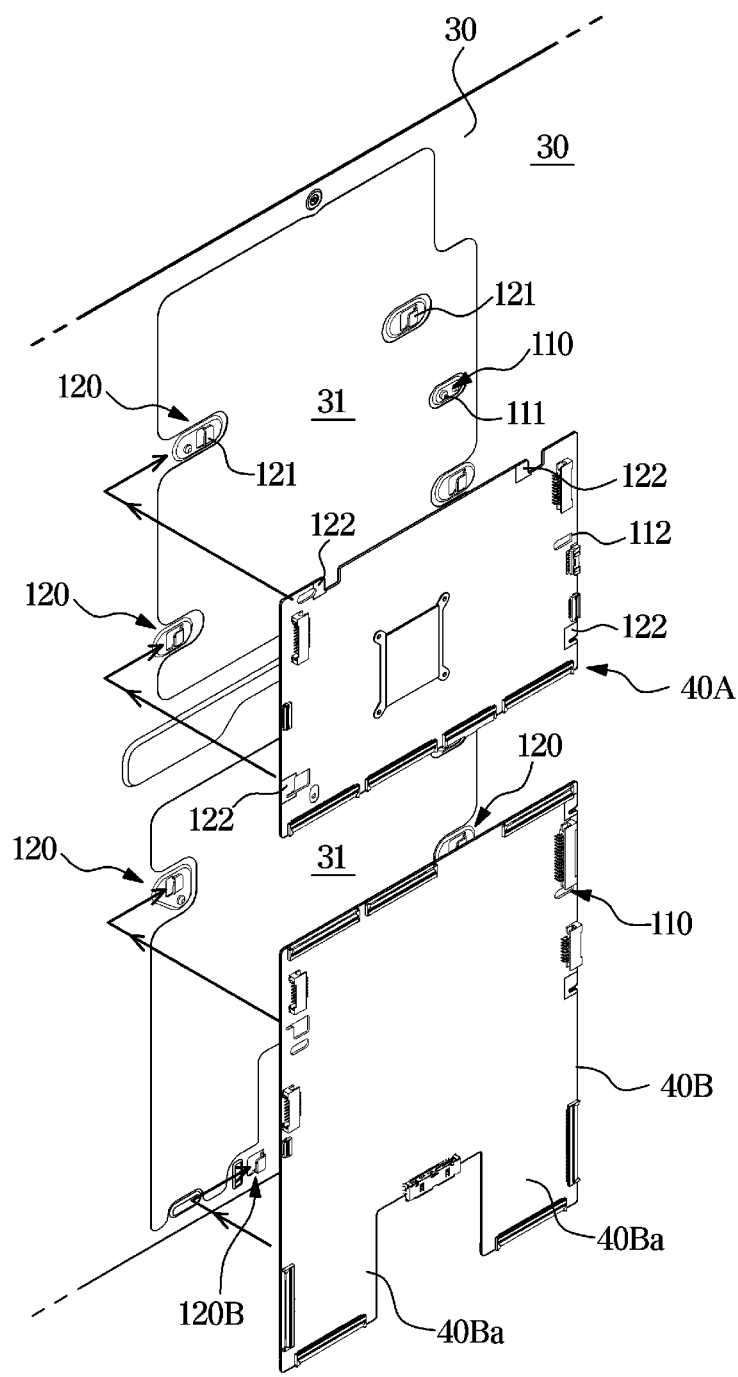
FIG. 13 is a view schematically illustrating an assembled state of PCBs having various shapes and a panel according to another embodiment of the present disclosure.

FIG. 13 is a view schematically illustrating an assembled state of PCBs having various shapes and a panel according to another embodiment of the present disclosure.

FIG. 13 is a view illustrating a state in which PCBs 40 having various sizes are mounted on a panel 30.

A first PCB 40A having a rectangular shape may have four fixing portions 120 and two guide portions 110. The four fixing portions 120 may be formed at one or more portions of the second region A2 of the PCB 40. Grounding portions 122 may be located at the left and right upper edges of the PCB 40 and the ground portion 122 may also be located at one or more portions of the right edge and the left edge.

Four mounting portions 121 may be provided at positions of the panel 30 corresponding thereto.

In this case, the guide portions 110 may be located at the left upper edge and at the center of the right edge. The positions of the fixing portion 120 and the guide portion 110 may vary according to positions of electronic components mounted on the PCB 40.

In addition, when a PCB 40B having a large size with an irregular shape is used, for example, a PCB 40B including protrusions 40Ba and 40Bb protruding from a rectangular shape is used, a fixing portion 120B for fixing at least one portion of the protrusions 40Ba and 40Bb may be provided.

Since PCBs 40 having various sizes and shapes may be firmly fixed to the panel 30 by sliding the PCB 40 by the guide portion 110, the fixing portion 120, and the dislocation prevention portion 130, a manufacturing process may be simplified with improved productivity.

Since the PCB may be directly mounted on the chassis in the electronic appliance including the PCB assembly according to an embodiment of the present disclosure, the effect of reducing the use of screws, clips, or adhesives conventionally used in assembly processes may be obtained and the effect of reducing manufacturing costs for the electronic appliance may be obtained by decreasing the numbers of parts and workers required to use screws or clips.

Since the electronic appliance including the PCB assembly may have a reduced thickness by directly mounting the PCB on the chassis, the effect of realizing an ultra-slim device may be obtained.

In addition, since assembling and disassembling of the PCB may be repeated without using separate parts for mounting the PCB, the effect of easily separating or replacing the PCB for maintenance may be obtained.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. A printed circuit board (PCB) assembly comprising:
   a panel comprising a guide protrusion, a mounting portion, and a dislocation prevention protrusion having an inclined plane and being spaced apart from the guide protrusion and the mounting portion; and
   a PCB comprising a guide hole formed to correspond to the guide protrusion, a grounding portion formed to correspond to the mounting portion, and a dislocation prevention hole formed to correspond to the dislocation prevention protrusion,
   wherein the guide protrusion is slidable in the guide hole to guide a sliding movement of the PCB so that the PCB becomes coupled to the mounting portion, the grounding portion becomes connected to the mounting portion, and the PCB slides along the inclined plane of the dislocation prevention protrusion to cause the dislocation prevention hole to become coupled to the dislocation prevention protrusion to prevent the PCB from being separated from the panel.

2. The PCB assembly of claim 1, wherein the coupling of the PCB to the mounting portion fixes the PCB to the panel, and the connecting of the grounding portion to the mounting portion is to electrically ground the PCB to the panel.

3. The PCB assembly of claim 1, wherein the guide hole and the guide protrusion provide for a horizontal sliding movement of the PCB.

4. The PCB assembly of claim 3, wherein
   the PCB has a first region on which an electronic component is mounted, and a second region other than the first region,
   the guide hole is formed at an upper portion or a lower portion of the second region, and
   the guide protrusion is formed in the panel on a position corresponding to the guide hole.

5. The PCB assembly of claim 4, wherein the guide hole is located at an upper portion or a lower portion of the second region in a diagonal direction to prevent rotational movement of the PCB.

6. The PCB assembly of claim 4, wherein
   the grounding portion is formed at the second region, and
   the mounting portion is formed in the panel at a position corresponding to the grounding portion.

7. The PCB assembly of claim 1, wherein the mounting portion comprises:
   an open surface formed to be open to allow the PCB to be inserted into the mounting portion,
   a fixing surface provided to hold the PCB inserted into the mounting portion, and
   two support surfaces extending from the fixing surface to be perpendicular to the fixing surface and provided to support the PCB inserted into the mounting portion.

8. The PCB assembly of claim 7, wherein the mounting portion comprises a guide extending from the fixing surface to guide insertion of the PCB.

9. The PCB assembly of claim 8, wherein the guide is formed to be inclined downward in a sliding direction of the PCB.

10. The PCB assembly of claim 1, wherein
the dislocation prevention protrusion comprises a stopper, and
the stopper is accommodatable in the dislocation prevention hole to prevent the PCB from moving when the PCB becomes coupled to the mounting portion.

11. The PCB assembly of claim 1, wherein the inclined plane is formed to be inclined upward in a sliding direction of the PCB.

12. An electronic appliance comprising:
a panel; and
a printed circuit board (PCB) mounted on the panel, wherein
the panel comprises a guide protrusion, a mounting portion, and a dislocation prevention protrusion having an inclined plane and being spaced apart from the guide protrusion and the mounting portion, and
the PCB comprises a guide hole formed to correspond to the guide protrusion, a grounding portion formed to correspond to the mounting portion, and a dislocation prevention hole formed to correspond to the dislocation prevention protrusion,
the PCB and the panel thereby being configured so that, to mount the PCB on the panel, the guide protrusion is slidable in the guide hole to guide a sliding movement of the PCB so that the PCB becomes coupled to the mounting portion, the grounding portion becomes connected to the mounting portion, and the PCB slides along the inclined plane of the dislocation prevention protrusion to cause the dislocation prevention hole to become coupled to the dislocation prevention protrusion to prevent the PCB from being separated from the panel.

13. The electronic appliance of claim 12, wherein the guide hole and the guide protrusion provide for a horizontal sliding movement of the PCB.

14. The electronic appliance of claim 12, wherein the guide hole is located at an upper portion or a lower portion of the PCB in a diagonal direction to prevent rotational movement of the PCB.

15. The electronic appliance of claim 12, wherein
electronic components are mounted on the PCB,
the grounding portion is formed on the PCB where an electronic component is not mounted, and
the mounting portion is formed in the panel at a position corresponding to the grounding portion.

16. The electronic appliance of claim 12, wherein the mounting portion comprises:
an open surface formed to be open to allow the PCB to be inserted into the mounting portion,
a fixing surface provided to hold the PCB inserted into the mounting portion, and
two support surfaces extending from the fixing surface to be perpendicular to the fixing surface and provided to support the PCB inserted into the mounting portion.

17. The electronic appliance of claim 16, wherein the mounting portion comprises a guide extending from the fixing surface to be inclined downward in a sliding direction of the PCB to guide insertion of the PCB.

18. The electronic appliance of claim 12, wherein
the dislocation prevention protrusion comprises a stopper, and,
with the PCB mounted on the panel, the stopper is accommodated in the dislocation prevention hole to prevent the PCB from moving.

19. A printed circuit board (PCB) assembly comprising:
a panel comprising a guide protrusion, a mounting portion, and a dislocation prevention protrusion having an inclined plane and being spaced apart from the guide protrusion and the mounting portion; and
a PCB comprising a guide hole, a grounding portion, and a dislocation prevention hole,
wherein the guide protrusion is slidable in the guide hole to guide a sliding movement of the PCB so that the PCB becomes coupled to the mounting portion to fix the PCB to the panel, the grounding portion becomes connected to the mounting portion to electrically ground the PCB to the panel, and the PCB slides along the inclined plane of the dislocation prevention protrusion to cause the dislocation prevention hole to become coupled to the dislocation prevention protrusion to prevent dislocation or separation of the PCB from the panel.

* * * * *